PROGRAMMABLE SAWTOOTH WAVEFORM GENERATOR

Filed Oct. 5, 1967 4 Sheets-Sheet 1

INVENTORS
JAMES W. HENDERSON
LEONARD PRYMAK
BY John C Black
ATTORNEY

United States Patent Office 3,514,632

Patented May 26, 1970

3,514,632

PROGRAMMABLE SAWTOOTH WAVEFORM GENERATOR

James W. Henderson, Bedford, Mass., and Leonard Prymak, Endicott, N.Y., assignors to International Business Machines Corporation, Armonk, N.Y., a corporation of New York Filed Oct. 5, 1967, Ser. No. 673,218

Int. Cl. H03k *4/00*

U.S. Cl. 307—228 5 Claims

ABSTRACT OF THE DISCLOSURE

The amplitude, period, polarity and reference level of a sawtooth waveform are rapidly and precisely controlled. A positive current source or a negative current sink is selectively connected to one or more integrating capacitors. Discriminating means are rendered effective when the voltage across the capacitors reaches a selected positive or negative value for activating switch means to discharge the capacitors; and the cycle is repeated. The capacitor voltage is applied to a power amplifier. The peak amplitude at the output of the power amplifier is compared with a reference voltage in a differential amplifier in a negative feedback loop around the power amplifier. The feedback loop adjusts the peak amplitude at the output of the power amplifier to the reference voltage level. The polarity of the sawtooth signal at the output of the power amplifier is determined by which of the current sources (positive or negative) is applied to the integrating capacitors. The current level of the source is externally controlled to determine the period of the sawtooth waveform. The level of the reference voltage applied to the differential amplifier determines the maximum level of the sawtooth waveform at the required load driving capability, and a controllable D-C power supply coupled to the power amplifier output determines the offset or reference level of the sawtooth waveform.

BACKGROUND OF THE INVENTION

Field of the invention

The primary application of this function generator is to provide the required stimulus to functionally test non-digital circuits. The programmability is necessary to achieve flexibility and rapid setup times as we change the type of circuit being tested. Flexibility is required in order to produce sawtooth waveforms with different polarities, periods, amplitudes and offset levels because of the many differing types of circuits being tested, each requiring its own specific input waveform. One of the problems is to design a circuit in which each of the parameters, i.e. polarity, amplitude, period, offset is programmable independent of each and every other parameter.

At first glance, the solution to the variable sawtooth generator problem would appear to lie simply with the charging of a capacitor to a selected voltage level with a constant current source of preselected value and then discharging the capacitor. However, this does not maintain independent control of amplitude and period because the current level which establishes the period also depends upon the selected amplitude of the sawtooth waveform. Hence, some design approach is required for assuring independent control of the waveform variables.

Summary of the invention

In a preferred embodiment, an electronic switch couples alternatively a positive or a negative current source to one or more integrating capacitors. The particular current source which is connected determines the polarity of the desired sawtooth waveform. The level of the current, which must charge the capacitors linearly, determines the period of the waveform; and also, the number of capacitors which are being charged by the current source determines the range within which the desired period exists. A buffering emitter follower couples the capacitors to positive and negative level detectors. When the voltage across the capacitors reaches a predetermined positive or negative level, one of the detectors actuates a respective switch to discharge the capacitors; and the cycle is repeated. It will be noted that the voltage appearing across the capacitors has a sawtooth waveform with a fixed maximum absolute amplitude; however, this is not necessarily the amplitude of the sawtooth waveform which is required for the test apparatus output.

At this point, we have produced at the output of the emitter follower a sawtooth waveform of a very precisely fixed period independent of the selected polarity and independent of the desired maximum amplitude and reference level of the test sawtooth waveform.

The output of the emitter follower is applied also to a power amplifier by way of a suitable variable resistance element, for example an optoelectronic device sold under the trademark Raysistor. This device includes a photoresistor, e.g. cadmium sulfide and a light source, e.g. an incandescent lamp. The output of the power amplifier is connected to one input of the differential amplifier, the other input of the amplifier being coupled to a programmable reference voltage level.

The circuit coupling the output of the power amplifier to the differential amplifier includes a capacitor for storing the peak amplitude of the sawtooth waveform appearing at the output of the power amplifier and applies this peak voltage to the differential amplifier input. If the peak amplitude is less than the level of the reference voltage applied to the other input of the differential amplifier, the output of the differential amplifier will control the light source in the optoelectronic device to decrease the value of the resistive element, thereby increasing the input and, therefore, the output signal levels of the power amplifier.

This action continues until the peak amplitude is substantially equal to the reference voltage applied to the differential amplifier. In the event that the peak amplitude should exceed the reference voltage applied to the differential amplifier, the value of the resistive element in thet Raysistor will be increased to decrease both the input and output levels of the power amplifier. In this way, the precise peak amplitude of the output signal from the power amplifier is fixed as a function of the programmed reference voltage.

The gain of the differential amplifier and the gain of the power amplifier will essentially determine the accuracy of the peak amplitude of the sawtooth waveform at the output of the power amplifier, greater accuracies being achieved by higher gains in the amplifiers. The feedback loop around thet power amplifier which includes the peak storage circuit, the differential amplifier and the optoelectronic device assures accuracy of the waveform amplitude independent of the varying loads to which it is applied.

An additional programmed supply is coupled to the output of the power amplifier and determines the D-C reference level of the sawtooth waveform.

BRIEF DESCRIPTION OF THE DRAWINGS

The foregoing and other objects, features and advantages of the invention will be apparent from the following more particular description of a preferred embodiment of the invention, as illustrated in the accompanying drawings.

In the drawings:

FIGS. 2*a*–2*c* are a schematic diagram of one preferred implementation of the diagrammatic illustration of FIG. 1; and FIG. 3 illustrates the manner in which FIGS. 2*a*–2*c* are arranged.

DESCRIPTION OF THE PREFERRED EMBODIMENT

Figure 1:
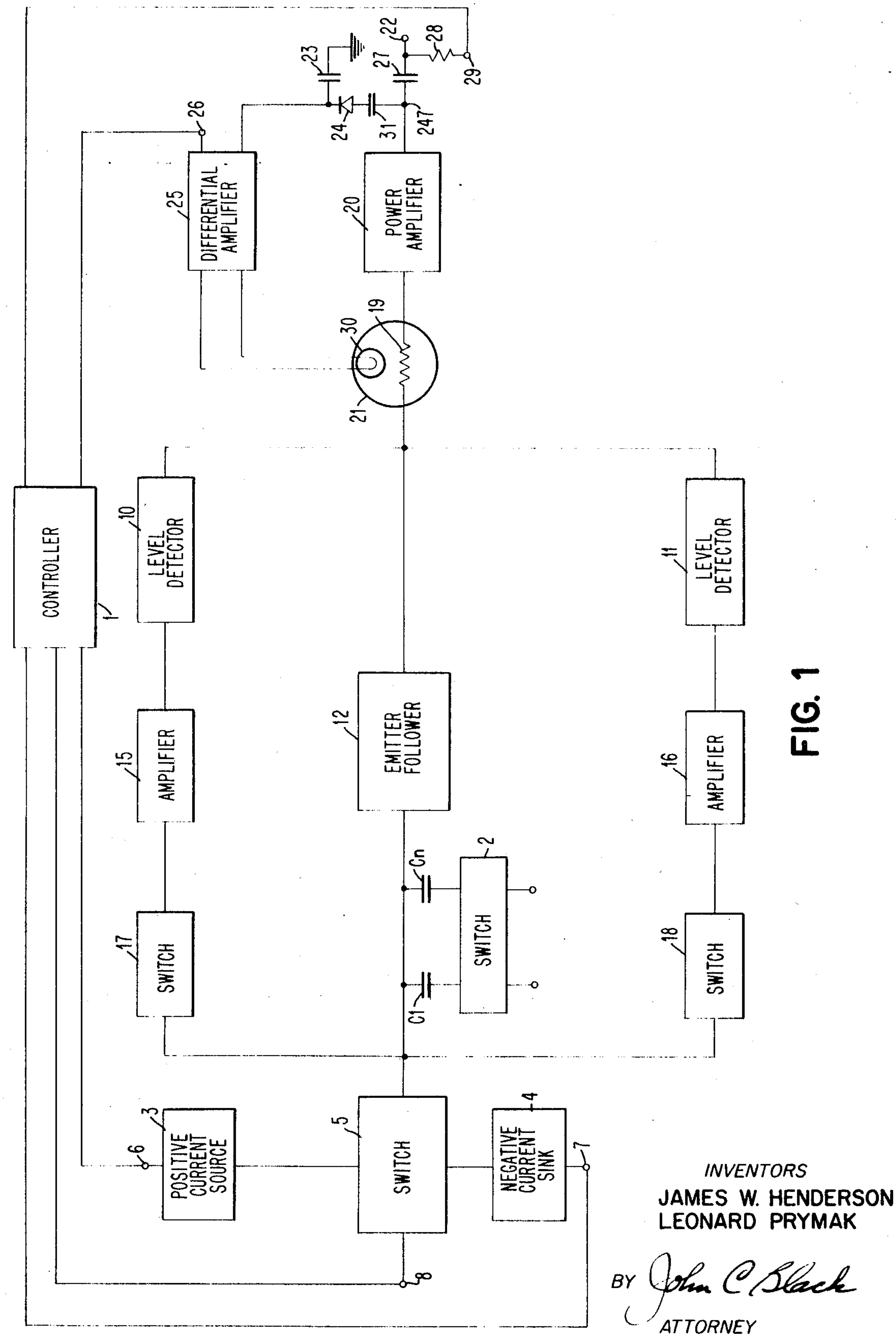
FIG. 1 illustrates diagrammatically the improved sawtooth waveform generator of the present application.

In FIG. 1 a plurality of storage capacitors C1–C*n* are selectively coupled to ground potetntial by means of a switching circuit 2. A positive current source 3 or alternatively a negative current source (or sink) 4 is selectively coupled to the capacitors by way of a switch 5.

An input terminal 6 to the source 3 is coupled to a source of D-C voltage (not shown) in a controller 1, the level of this voltage determining the current level of the source 3. A terminal 7 is connected to a source of D-C voltage (not shown) in the controller, which latter voltage determines the level of the current in the source 4. A terminal 8 is coupled to a source of bivalued signals (not shown) in the controller, which signals determine the condition of the switch 5 for alternatively coupling source 3 or source 4 to the capacitors.

The capacitors are coupled to positive and negative level detetctors 10 and 11 by way of a buffering emitter follower 12. Amplifiers 15 and 16 are coupled to the outputs of the detectors 10 and 11 and have their outputs coupled to switches 17 and 18.

The output of the emitter follower 12 is coupled to a power amplifier 20 by way of the resistive element 19 of an optoelectronic device 21. The output of the power amplifier 20 is coupled to an output terminal 22 by way of a coupling capacitor 27 at which terminal the desired sawtooth waveform is established. The output of the power amplifier is also coupled to a peak storing capacitor 23 by way of a diode 24. The diode 24 and the capacitor 23 are coupled to one input of a differential amplifier 25, the other input terminal 26 being coupled to a programmable voltage source (not shown) in the controller 1. The output of the differential amplifier 25 is coupled to the light source 30 of the device 21. The output terminal 22 is coupled to a source of programmable D-C voltage (not shown) in the controller 1 by way of a resistor 28 and a terminal 29.

Before describing the operation of the sawtooth generator of FIG. 1, it may be helpful to rather briefly describe a typical test environment within which the generator is utilized. The generator of FIG. 1 together with a multiplicity of other electrical condition producing circuits have their outputs wired into a test receptacle which is adapted to receive circuit cards which are to be tested. In addition, there will be available to an operator (who manually or perhaps semiautomatically inserts circuit cards into the test receptacle) additional means for determining the attainment of the test specifications, for example, an oscilloscope. The programmed controller 1 will have preset the generator of FIG. 1 together with other electrical condition producing circuits connected to the test receptatcle to the desired conditions which are required for testing a specific type of circuit.

The operator inserts a circuit card into the test receptacle and manually causes the controller to run through a sequence of test steps, visually observing the results of each or some of the steps on the oscilloscope to determine whether or not circuit specifications are met. When all test steps have been completed, the card is removed for the insertion of the next succeeding circuit card.

The operation of the generator of FIG. 1 is as follows. The selected voltage levels are applied to the terminals 6, 7, 26 and 29 for determining the desired frequency, amplitude and reference parameters of the sawtooth waveform which will be produced at the output terminal 22. A signal of the selected bivalued level is applied to the terminal 8 to determine the condition of the switch 5 for coupling alternatively the source 3 or the source 4 to the capacitors C1–C*n*, thereby to select the polarity of the waveform. The switch circuit 2 is selectively energized to couple one or more of the capacitors C1–C*n* to ground potential to select the frequency range of the sawtooth waveform. The other capacitors are ineffective. The selected current source 3 or 4 begins charging the selected capacitors linearly. The voltage level appearing across the capacitors is coupled to the level detectors 10 and 11 by way of the emitter follower 12.

When the voltage level across the capacitors reaches a voltage equal to the threshold level of either the detector 10 or 11 less the voltage drop across the emitter follower 12, the detector produces an output pulse which is amplified by its respective amplifier 15 or 16 to actuate its respective switch 17 or 18. The actuated switch rapidly discharges those capacitors which have been charged by the current source.

As the capacitors discharge, the output pulse from the detector 10 or 11 is terminated and the switch 17 or 18 is open circuited.

The circuit is now ready to again charge the effective capacitors to produce the next sawtooth signal.

The continuous sawtooth waveform from the emitter follower 12 is applied to the amplifier 20. The waveform is amplified and applied to the output terminal 22 and also to the peak storage capacitor 23. The peak voltage across the capacitor 23 is compared in the differential amplifier 25 with the programmed voltage at terminal 26. The amplifier 25 energizes the light source 30 as a function of the difference between the voltage levels at 26 and across 23. The emitted light in turn varies the resistance of the element 19 in such a manner as to produce at terminal 247 peak amplitudes equal to or a function of the voltage level at 26.

The voltage applied to terminal 29 fixes the offset level of the waveform at terminal 22.

Figure 2A:
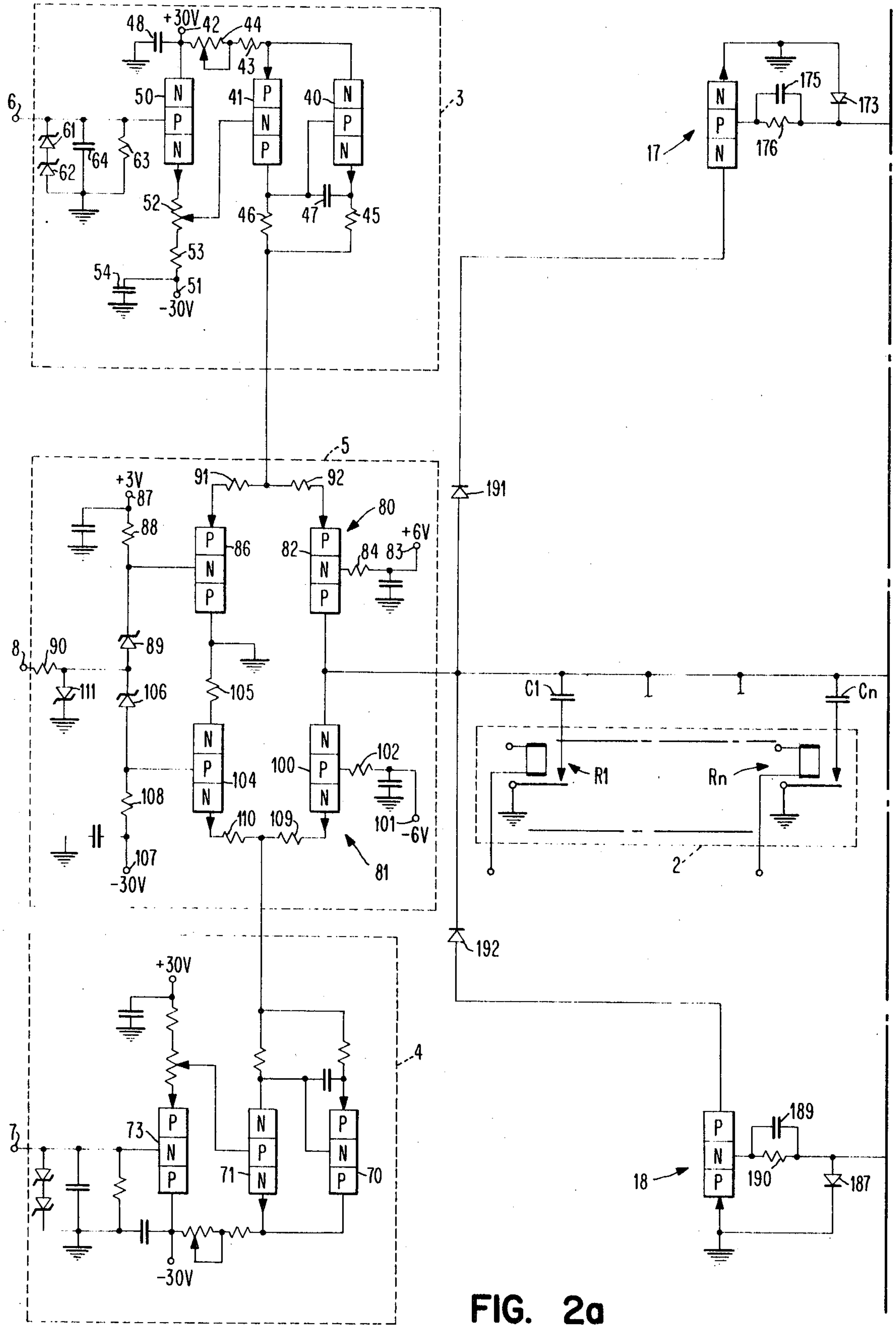
Figure 2B:
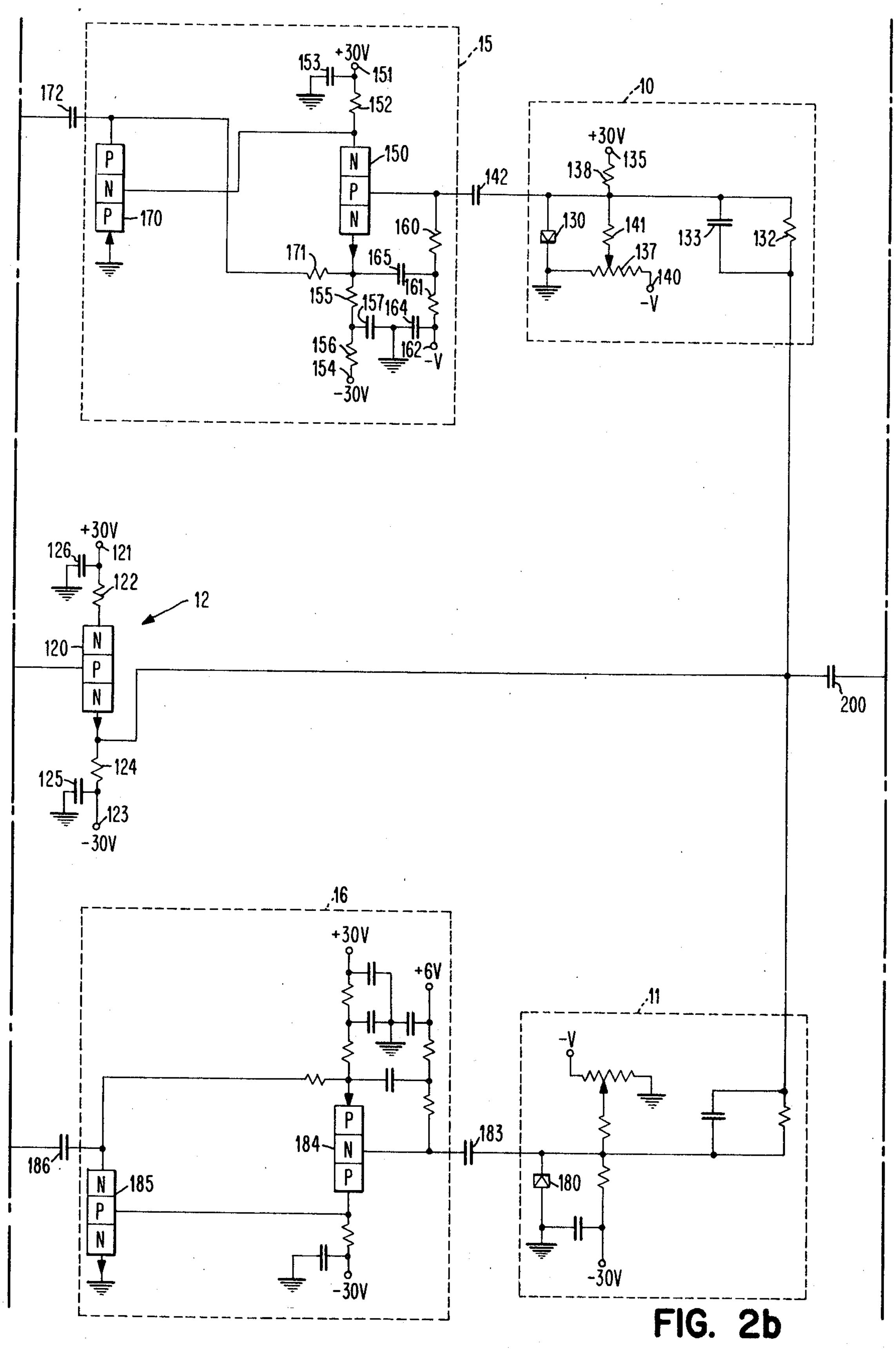
Figures 2C, 3:
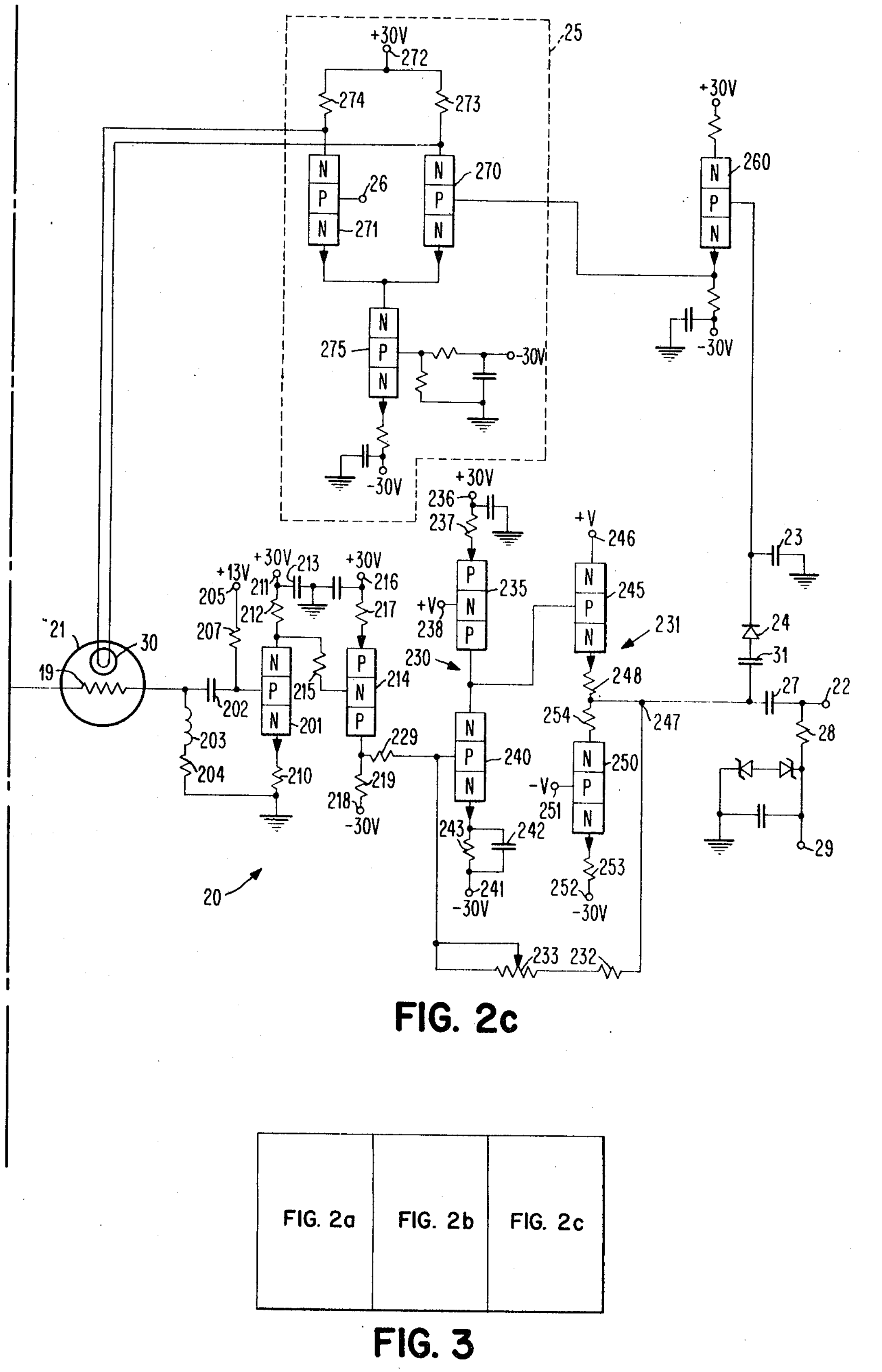

One preferred implementation of the generator of FIG. 1 is illustrated in FIGS. 2*a*–2*c*. The positive current source 3 comprises a pair of transistors 40 and 41, operating as a Darlington pair in the common base configuration. The collector electrode of the transistor 40 and the emitter electrode of the transistor 41 are connected to a positive supply terminal 42 by way of a resistor 43 and an adjustable potentiometer 44. The emitter electrode of the transistor 40 and the collector electrode of the transistor 41 are connected to the switch 5 by way of resistors 45 and 46 respectively. A capacitor 47 is connected between the emitter electrode of the transistor 40 and the collector electrode of the transistor 41, and the base electrode of the transistor 40 is connected directly to the collector electrode of the transistor 41. A decoupling capacitor 48 is connected between the supply terminal 42 and ground potential.

The means for setting the current level of the source 3 include an emitter follower transistor amplifier 50 having its collector electrode connected to the supply terminal 42 and its emitter electrode connected to a negative supply terminal 51 by way of an adjustable potentiometer 52 and a resistor 53. The movable contact of the potentiometer 52 is connected directly to the base electrode of the transistor 41. A decoupling capacitor 54 connects the negative supply terminal 51 to ground potential. The controller 1 applies a potential to the base electrode of the transistor 50 via terminal 6 to determine the precise level of the current output from the source 3. A pair of Zener diodes 61 and 62 is coupled between the terminal 6 and ground potential to limit the positive and negative excursions of the input signal at the terminal 6. A resistor 63 and a capacitor 64 are coupled between the input terminal 6 and ground potential to minimize noise in the current source.

By setting the voltage at the base of the transistor 50, we control the current which flows through the resistor 43 and the potentiometer 44, and ultimately through both of the transistors 40, 41 to charge the capacitors C1–Cn at a constant rate. To achieve good linearity in the ramp portion of the waveform, it is essential that the current remain constant as the voltage varies across the capacitors.

The negative current source 4 is generally similar to the current source 3 and will not be described in detail. The current source 4 includes a pair of transistors 70 and 71 which supply current for the capacitors C1–Cn and an emitter follower transistor 73 which in part determines the level of the current output of the transistors 70, 71 in response to the potential applied to the input terminal 7.

The switch 5 comprises a pair of differential amplifiers 80 and 81. The amplifier 80 includes a first transistor 82 having its base electrode coupled to a positive supply terminal 83 by way of a resistor 84. The amplifier 80 includes a second transistor 86 having its collector electrode connected to ground potential and its base electrode connected to a positive supply terminal 87 by way of a resistor 88 and to the input terminal 8 by way of a Zener diode 89 and a resistor 90.

The emitter electrodes of the transistors 82 and 86 are connected to the output of the positive supply source 3 by way of resistors 91 and 92. The collector electrode of the transistor 82 is connected to one terminal of the integrating capacitors C1–Cn.

The differential amplifier 81 includes a first transistor 100 having its collector electrode connected to the integrating capacitors C1–Cn and having its base electrode connected to a negative supply terminal 101 by way of a resistor 102.

The amplifier 81 includes a second transistor 104 having its collector electrode connected to ground potential by way of a resistor 105 and its base electrode connected to the input terminal 8 by way of a Zener diode 106 and the resistor 90. The base electrode of the transistor 104 is also connected to a negative supply terminal 107 by way of a resistor 108. The emitter electrodes of the transistors 100 and 104 are connected to the output of the negative current source 4 by way of resistors 109 and 110.

A Zener diode 111 couples the junction between diodes 89 and 106 to ground.

Suitable input levels to the junction 8 are (1) ground potential to couple the source 3 to the capacitors C1–Cn and (2) minus thirty volts to couple the source 4 to the capacitors.

When ground potential is applied to terminal 8, the diode 89 establishes at the base electrode of the transistor 86 a voltage slightly more positive than that at the base of transistor 82, whereby transistor 86 turns off and transistor 82 couples the current output from the source 3 to the capacitors. Transistor 104 turns on and transistor 100 turns off.

When the negative potential is applied to the terminal 8, the diodes 111 and 106 establish at the base electrode of transistor 104 a potential slightly more negative than that at the base of the transistor 100, whereby transistor 104 turns off and transistor 100 turns on to couple the source 4 to the capacitors. The negative potential at terminal 8 also turns the transistor 86 on and the transistor 82 off.

The capacitors C1–Cn are selectively coupled to ground potential by means of relay switches R1–Rn under the direction of the controller. The capacitors are in turn coupled to the emitter follower 12 which includes a transistor 120 having its collector electrode connected to a positive supply terminal 121 by way of a resistor 122 and its emitter electrode connected to a negative supply terminal 123 by way of a resistor 124. Decoupling capacitors 125 and 126 couple the terminals 123 and 121 to ground potential.

The level detector 10 includes a tunnel diode 130 coupled to the output of the emitter follower 12 by way of a parallel-connected resistor 132 and speed-up capacitor 133. A bias circuit for the diode 130 includes a positive supply terminal 135, resistors 138 and 141, a potentiometer 137 and a negative supply terminal 140.

The diode 130 is normally biased to its low voltage, high current stable state and is switched to its high voltage state by an incoming signal level of predetermined value.

The output of the level detector 10 is coupled to the amplifier 15 by way of a capacitor 142, the capacitor being connected to the base electrode of a first stage transistor 150 in the amplifier 15. The collector electrode of the transistor 150 is coupled to a positive supply terminal 151 by way of a resistor 152. A decoupling capacitor 153 is connected between the terminal 151 and ground potential. The emitter electrode of the transistor 150 is connected to a negative supply terminal 154 by way of resistors 155 and 156. A capacitor 157 connects the junction between the resistors 155 and 156 to ground potential.

The base electrode of the transistor 150 is connected to a bias circuit including resistors 160 and 161, a negative supply terminal 162 and a decoupling capacitor 164. A feedback capacitor 165 and the resistor 160 couple the emitter electrode of the transistor 150 to its base electrode for bootstrap type of operation with a high input impedance.

A second stage grounded emitter transistor amplifier 170 has its base electrode connected directly to the collector electrode of the transistor 150 and its collector electrode to the emitter electrode of the transistor 150 by way of a resistor 171 for positive feedback to speed up signal transitions. The collector electrode of the transistor 170 and the emitter electrode of the transistor 150 are coupled to the base electrode of the switch 17 by way of a circuit including a capacitor 172, a diode 173, and a parallel-connected capacitor 175 and resistor 176.

The amplifier stages 150 and 170 are operated Class A in the preferred embodiment.

The level detector 11, the amplifier 16 and the switch 18 are generally similar to the level detector 10, the amplifier 15 and the switch 17 described above and will not be described in great detail. Briefly, the level detector 11 includes a tunnel diode 180 coupled to the emitter electrode of the emitter follower 12. The output of the level detector 11 is coupled to the input of the amplifier 16 by way of a capacitor 183. The amplifier 16 includes a transistor 184 connected in a manner somewhat similar to that of transistor 150 except that the transistor 184 is of the opposite conductivity type and the supply potentials are of the opposite polarity. The transistor amplifier 184 is connected to a grounded emitter transistor amplifier 185 in much the same manner that the transistor 150 is connected to the transistor 170. The transistors 184 and 185 are coupled to the transistor switch 18 by way of a circuit including a capacitor 186, a diode 187, and a parallel-connected capacitor 189 and resistor 190.

The collector electrodes of the transistor switches 17 and 18 are connected to the capacitors C1–Cn by way of diodes 191 and 192 respectively.

The emitter electrode of the emitter follower 12 is also coupled to the resistive element 19 by way of a coupling capacitor 200. The other terminal of the resistive element is connected to the base electrode of a transistor 201 by way of a capacitor 202. The junction between the resistive element and the capacitor 22 is connected to ground potential by way of an inductive element 203 and a resistor 204. The other terminal of the capacitor 202 is connected to a positive supply terminal 205 by way of a resistor 207.

The transistor 201 forms the first stage of the power amplifier 20 and has its emitter electrode connected to ground potential by way of a resistor 210 and its collector electrode connected to a positive supply terminal 211 by way of a resistor 212. A decoupling capacitor 213 is connected between the terminal 211 and ground potential. The collector electrode of the transistor 201 is connected to the base electrode of a transistor 214 by way of a resistor 215.

The transistor 214 forms the second stage of amplification of the power amplifier 20 and has its emitter electrode connected to a positive supply terminal 216 by way of a resistor 217 and its collector electrode connected to a negative supply terminal 218 by way of a resistor 219. A decoupling capacitor 220 is connected between the terminal 216 and ground.

The amplifier stages comprising transistors 201 and 214 function primarily as a level shift circuit.

The collector electrode of the transistor 214 is connected to series input resistor 229 of an operational amplifier having a high voltage gain section 230 and a high current gain section 231 with shunt feedback comprising a resistor 232 and an adjustable potentiometer 233. The section 230 includes a constant current source comprising a transistor 235 having its emitter electrode connected to a positive supply terminal 236 by way of a resistor 237 and its base electrode connected to a positive supply terminal 238, the voltage level of which is less positive than that at the terminal 236.

The section 230 also includes a transistor amplifier 240 having its collector electrode connected to the collector electrode of the transistor 235 and having its emitter electrode connected to a negative supply terminal 241 by way of parallel-connected capacitor 242 and resistor 243. The series input resistor 229 is connected to the base electrode of the transistor amplifier 240.

The collector electrode of the transistor amplifier 240 is connected to the base electrode of a transistor 245 which forms the current amplifying section 231. The collector electrode of the transistor 245 is connected to a positive supply terminal 246 and its emitter electrode is connected to the power amplifier output terminal 247 by way of a resistor 248.

Also connected to the power amplifier output terminal 247 is a constant current source comprising a transistor amplifier 250 having its base electrode connected to a negative supply terminal 251, its emitter electrode connected to a larger negative supply terminal 252 by way of a resistor 253 and its collector electrode connected to the output terminal 247 by way of a resistor 254.

THE OUTPUT AMPLIFIER

The function of the amplifier 20 is to amplify the sawtooth waveform to the required drive capability without introducing excessive distortion. To achieve the power gain and to maintain good linearity, operational amplifier 230, 231 is designed for constant gain over the necessary band width. The high open loop voltage gain for the amplifier is achieved in the first stage 230 by using the effectively very large impedance of the transistor 235 in the common-base configuration as a load for the stage. The output of the high voltage gain stage drives the emitter follower 245 which provides the current drive capability at the output of the amplifier 20. The emitter follower uses a constant circuit source 250 as a load. This arrangement minimizes the power dissipation in the output transistor.

The output terminal 247 of the power amplifier 20 is connected to the peak storage capacitor 23 by way of the capacitor 31 and the diode 24. The capacitor 23 is coupled to one input of the differential amplifier 25 by way of a buffering emitter follower 260. The capacitor stores the most positive level of the output sawtooth waveform and applies it to the amplifier 25.

The differential amplifier includes transistors 270 and 271 having their collector electrodes coupled to a positive supply terminal 272 by way of resistors 273 and 274. A constant current source including transistor amplifier 275 supplies current to the emitter electrodes of the transistors 270 and 271. The light emitting element 30 has its terminals coupled directly to the collector electrodes of the transistors 270 and 271 for energization at a level which is a function of the potential difference between the collector electrodes. The intensity of the emitted light controls the resistance value of the element 19.

While the invention has been particularly shown and described with reference to a preferred embodiment thereof, it will be understood by those skilled in the art that various changes in form and details may be made therein without departing from the spirit and scope of the invention.

What is claimed is:

1. In test apparatus, a programmable free-running sawtooth waveform generator comprising,
   - a plurality of capacitors,
   - a positive current source adapted to supply constant current at selected levels,
   - a negative current source adapted to supply constant current at selected levels,
   - means selectively setting one of the sources to have a predetermined output current level,
   - first electronic switch means responsive to bivalued control signals for coupling the output of said selected one source to said capacitors,
   - means selectively rendering certain of the capacitors effective for charging by the selected source at a linear rate,
   - second electronic switch means coupled to the capacitors,
   - level detecting means effective each time the voltage across the effective capacitors reaches a preselected positive or negative level for actuating the second switch means to rapidly discharge the effective capacitors for subsequent charging by the selected current source,
   - a power amplifier producing at its output amplifier sawtooth signals corresponding in frequency to the voltage signals appearing across the effective capacitors,
   - a programmable source of reference signal; and
   - means responsive to a reference signal and to the power amplifier output signals for adjusting the gain of the amplifier to set the peak level of the output signals to a selected value as a function of the reference signal level.

2. The sawtooth waveform generator of claim 1 further comprising
   - means capacitively coupled to the amplifier output selectively setting the direct-current level of the output signals.

3. The sawtooth waveform generator of claim 1 wherein the means for adjusting the gain of the amplifier comprises
   - a voltage divider coupling the capacitor voltage signals to the power amplifier and including an electrical element having a resistance value which varies with the intensity of light impressed thereon,
   - a differential amplifier having one input coupled to the reference signal source, and having a second input and an output,
   - a voltage peak storing circuit coupling the output of the power amplifier to the second input of the differential amplifier to produce at the output of the differential amplifier a signal which is a function of the difference between the reference signal level and the peak amplitude of the power amplifier output signals,
   - a light source coupled to the differential amplifier output and impressing light upon the electrical element to vary its resistance as a function of the differential amplifier output signal.

4. The sawtooth waveform generator of claim 3 wherein the power amplifier comprises
   - a first high gain voltage amplifying stage, a second high gain current amplifying stage,
a negative feedback means coupled around said stages, and
active constant current load devices for each stage to improve the linearity of the output sawtooth waveform.

5. The sawtooth waveform generator of claim 1 wherein the level detecting means includes positive and negative detecting circuits, each circuit comprising
a tunnel diode biased to one of its stable states and switched to its opposite stable state in response to a capacitor voltage of a predetermined level and polarity, and
a Class A amplifier coupling the tunnel diode to the second switch means to actuate the latter incident to switching of the tunnel diode to its opposite state, said tunnel diode switching back to its one state incident to discharging of the capacitors.

References Cited

UNITED STATES PATENTS

| | | | |
|---|---|---|---|
| 3,072,856 | 1/1963 | Close | 328—67 X |
| 3,320,434 | 5/1967 | Ott | 307—236 X |
| 3,428,828 | 2/1969 | Korzekwa et al. | 307—235 |

JOHN S. HEYMAN, Primary Examiner

R. L. WOODBRIDGE, Assistant Examiner

U.S. Cl. X.R.

307—235, 236; 328—67, 127